(12) United States Patent
Klein (10) Patent No.: US 11,670,630 B2
(45) Date of Patent: Jun. 6, 2023

(54) MULTI-CHIP STRUCTURE INCLUDING A MEMORY DIE STACKED ON DIE HAVING PROGRAMMABLE INTEGRATED CIRCUIT

(71) Applicant: XILINX, INC., San Jose, CA (US)

(72) Inventor: Matthew H. Klein, Redwood City, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/693,256

(22) Filed: Mar. 11, 2022

(65) Prior Publication Data

US 2022/0199604 A1 Jun. 23, 2022

Related U.S. Application Data

(63) Continuation of application No. 16/392,170, filed on Apr. 23, 2019, now Pat. No. 11,282,824.

(51) Int. Cl.
*H01L 25/18* (2023.01)
*H01L 23/48* (2006.01)
*H01L 23/00* (2006.01)
*H01L 25/00* (2006.01)
*H01L 25/065* (2023.01)

(52) U.S. Cl.
CPC ............ *H01L 25/18* (2013.01); *H01L 23/481* (2013.01); *H01L 24/16* (2013.01); *H01L 25/50* (2013.01); *H01L 25/0657* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2225/06565* (2013.01); *H01L 2924/1431* (2013.01); *H01L 2924/1436* (2013.01)

(58) Field of Classification Search
CPC ....................................................... H01L 25/18
See application file for complete search history.

(56) References Cited

U.S. PATENT DOCUMENTS

| | | |
|---|---|---|
| 7,701,251 B1 | 4/2010 | Rahman et al. |
| 8,356,138 B1 | 1/2013 | Kulkarni et al. |
| 9,135,185 B2 | 9/2015 | Loh et al. |
| 9,298,573 B2 | 3/2016 | Kobla et al. |
| 9,941,253 B1 | 4/2018 | Jung et al. |
| 2012/0272112 A1 | 10/2012 | Oh et al. |
| 2014/0013169 A1 | 1/2014 | Kobla et al. |
| 2014/0085959 A1 | 3/2014 | Saraswat et al. |
| 2014/0181458 A1 | 6/2014 | Loh et al. |
| 2015/0016172 A1 | 1/2015 | Loh et al. |
| 2015/0357306 A1 | 12/2015 | Thottethodi et al. |

OTHER PUBLICATIONS

"High Bandwith Memory", Wikipedia, last edited Dec. 18, 2018 (https://en.wikipedia.org/wiki/High_Bandwith_Memory).
Ahmad, Sagheer, et al., "Hot Chips 2017 Xilinx 16nm Datacenter Device Family with In-Package HBM and CCIX Interconnect", (https://www.hotchips.org/wp-content/uploads/hc_archives/hc29/HC29.22-Tuesday-Pub/HC29.22.50-FPGA-Pub/HC29.22.530-Datacenter-16nm-Singh-Xilinx-VU37p-rev5.pdf on Mar. 25, 2019).

*Primary Examiner* — Douglas M Menz
(74) *Attorney, Agent, or Firm* — Patterson + Sheridan, LLP (57) ABSTRACT

Some examples described herein provide for a multi-chip structure including one or more memory dies stacked on a die having a programmable integrated circuit (IC). In an example, a multi-chip structure includes a package substrate, a first die, and a second die. The first die includes a programmable IC, and the programmable IC includes a memory controller. The first die is on and attached to the package substrate. The second die includes memory. The second die is stacked on the first die. The memory is communicatively coupled to the memory controller.

17 Claims, 6 Drawing Sheets

MULTI-CHIP STRUCTURE INCLUDING A MEMORY DIE STACKED ON DIE HAVING PROGRAMMABLE INTEGRATED CIRCUIT

CROSS REFERENCE TO RELATED APPLICATION

This application is a continuation of U.S. Non-Provisional application Ser. No. 16/392,170, filed on Apr. 23, 2019, of which is incorporated herein by reference in its entirety.

TECHNICAL FIELD

This disclosure relates to a multi-chip structure and methods of forming such structure and, in particular, to a multi-chip structure including one or more memory dies stacked on a die having a programmable integrated circuit and methods of forming such structure.

BACKGROUND

A programmable integrated circuit (IC) refers to a type of IC that includes programmable circuitry. An example of a programmable IC is a field programmable gate array (FPGA). An FPGA is characterized by the inclusion of programmable circuit blocks. Circuit designs may be physically implemented within the programmable circuitry of a programmable IC by loading configuration data, sometimes referred to as a configuration bitstream, into the device. The configuration data may be loaded into internal configuration memory cells of the device. The collective states of the individual configuration memory cells determine the functionality of the programmable IC. For example, the particular operations performed by the various programmable circuit blocks and the connectivity between the programmable circuit blocks of the programmable IC are defined by the collective states of the configuration memory cells once loaded with the configuration data.

SUMMARY

Some examples described herein provide for a multi-chip structure including one or more memory dies stacked on a die having a programmable integrated circuit (IC). Some examples described herein can obviate using an interposer and/or physical layer (PHY) interfaces, which can reduce processing costs, power consumption, and/or die area usage.

An example is a multi-chip structure. The multi-chip structure includes a package substrate, a first die, and a second die. The first die includes a programmable integrated circuit, and the programmable integrated circuit includes a memory controller. The first die is on and attached to the package substrate. The second die includes memory. The second die is stacked on the first die. The memory is communicatively coupled to the memory controller.

Another example is a method of forming a multi-chip structure. A first die is stacked on a second die. The first die includes memory. The second die includes a programmable integrated circuit, and the programmable integrated circuit includes a memory controller. The memory controller is communicatively coupled to the memory by the first die being stacked on the second die. The first die is attached to a package substrate.

A further example is a multi-chip structure. The multi-chip structure includes a package substrate, a first die, and a second die. The first die includes a field programmable gate array (FPGA) and a memory controller. The first die is on and attached to the package substrate. The second die includes memory. The second die is stacked on a side of the first die opposite from the package substrate. The memory is communicatively coupled to the memory controller.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Some examples described herein provide for a multi-chip structure including one or more memory dies stacked on a die having a programmable integrated circuit (IC). In some examples, the memory dies can implement memory for high bandwidth memory (HBM). In some examples, the programmable IC includes programmable logic regions, such as fabric of a field programmable gate array (FPGA). The programmable IC permits user-configurable front-end processing of data that is read from or to be written to memory of any of the memory dies.

Some examples described herein can obviate using an interposer. By having the memory dies be stacked on the base die including the programmable IC, no interposer (to which the base die and stack of memory dies would otherwise be individually attached) would be implemented. By obviating the interposer, expense associated with processing and including the interposer in the multi-chip stack is also avoided. Further, without the interposer, less processing to form the multi-chip stack may be implemented, which, in addition to reduced costs, can reduce processing cycle-time. Obviating the interposer and stacking the memory dies on the base die can also result in a package that has a smaller footprint and a smaller vertical profile.

Some examples described herein can obviate using physical layer (PHY) interfaces, such as HBM interfaces, in the multi-chip structure. Physical layer interfaces can consume power and area of a die. By avoiding using a physical layer interface, such as a HBM interface, physical layer interfaces on two dies (e.g., one on either side of the HBM physical layer connections) can be avoided, which can reduce power and reduce area usage of the two dies. Further, reducing area usage of the dies can reduce costs associated with processing to form the dies.

Some examples can achieve additional benefits. For example, a composite device formed by a multi-chip structure can be more easily tested and more easily placed in a multi-chip module, e.g., with other packages and/or dies. Also, a multi-chip structure as described herein with a programmable IC can allow customization of logic and functions adjacent to one or more memory dies (e.g., adjacent to one or more HBM dies). Such a multi-chip structure can permit a user to create a deployable custom device with, e.g., high memory bandwidth and lower power consumption in a single package. Further, such a multi-chip structure can preserve programmability and flexibility of programmability of programmable logic regions and boundary circuits, such as input/output circuits, transceiver circuits, and/or other circuits.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Figure 1:
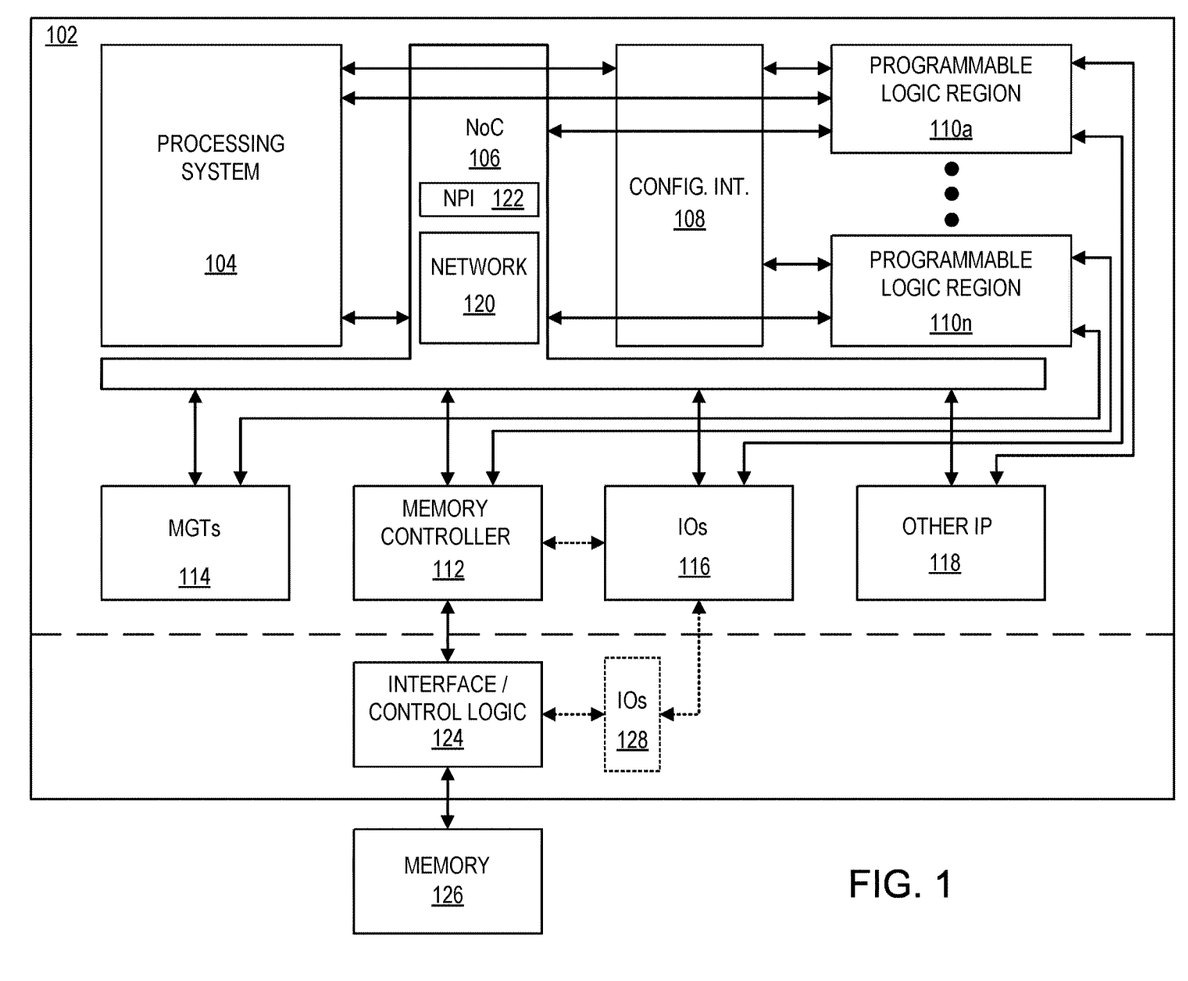
FIG. 1 is a block diagram depicting a programmable integrated circuit (IC) connected to external memory according to some examples

FIG. 1 is a block diagram depicting a programmable integrated circuit (IC) 102 connected to external memory according to some examples. The programmable IC 102 can be a System-on-Chip (SoC), and can include or be an IC that is a programmable logic device, such as a field programmable gate array (FPGA). The programmable IC 102 comprises a processing system 104, a network-on-chip (NoC) 106, a configuration interconnect 108, one or more programmable logic regions 110a through 110n (generically, individually, or collectively, "programmable logic region(s) 110"), a memory controller 112, multi-gigabit transceivers (MGTs) 114, input/output blocks (IOs) 116, and other IP circuits 118. The NoC 106 includes a routing network 120 and a NoC peripheral interconnect (NPI) 122.

In general, the processing system 104 is connected to the programmable logic region(s) 110 through the configuration interconnect 108. The processing system 104, programmable logic region(s) 110, memory controller 112, MGTs 114, IOs 116, and other IP circuits 118 are also connected to the NoC 106 (e.g., the routing network 120), and hence, may be communicatively coupled to each other via the NoC 106 (e.g., the routing network 120). The processing system 104, memory controller 112, MGTs 114, IOs 116, and other IP circuits 118 are also connected to respective subsets of the programmable logic region(s) 110. For example, each of the processing system 104, IOs 116, and other IP circuits 118 is connected to the programmable logic region 110a, and each of the memory controller 112 and MGTs 114 is connected to the programmable logic region 110n. The various circuits can be connected to any subset of the programmable logic region(s) 110, and the circuits may be connected in any combination with any other circuits to a given subset of the programmable logic region(s) 110. Additionally, in some examples, the memory controller 112 can be connected to at least one of the IOs 116.

The processing system 104 can include one or more processor cores. For example, the processing system 104 can include a number of ARM-based embedded processor cores.

The programmable logic region(s) 110 can include any number of configurable logic blocks, look-up tables (LUTs), digital signal processing blocks, random access memory blocks, etc., and programmable interconnect elements, such as described below. The programmable logic region(s) 110 may be programmed or configured using the processing system 104 through the configuration interconnect 108. For example, the configuration interconnect 108 can enable, for example, frame-based programming of the fabric of the programmable logic region(s) 110 by a processor core of the processing system 104 (such as a platform management controller (PMC)).

The routing network 120 of the NoC 106 provides routing of NoC packets between different systems or circuits. The routing network 120 includes NoC packet switches interconnected by line segments, which are between NoC master units (NMUs) and NoC slave units (NSUs). Each NMU is an ingress circuit that connects a master circuit to the NoC 106. Each NSU is an egress circuit that connects the NoC 106 to a slave endpoint circuit. Each NoC packet switch performs switching of NoC packets. Hence, the NMUs, NoC packet switches, and NSUs can be configured to provide a channel for communications between a master endpoint circuit to a slave endpoint circuit via an NMU, NoC packet switches interconnected by line segments, and an NSU. The NMUs, NoC packet switches, and NSUs also include register blocks, which are written to configure the respective NMU, NoC packet switch, and NSU. The register blocks can be written via the NPI 122. For example, a PMC of the processing system 104 can transmit memory mapped write requests to the NMUs, NoC packet switches, and NSUs via the NPI 122 to write to the register blocks to configure the NMUs, NoC packet switches, and NSUs. The NPI 122 can include interconnected NPI switches that can route the memory mapped write requests to the appropriate register block.

The IOs 116 can be any input/output circuit to communicatively couple the programmable IC 102 with other circuits and/or systems. In some examples, the IOs 116 can include high bandwidth memory (HBM) interface circuits, high density input/output (HDIO) circuits, peripheral component interconnect express (PCIe) circuits, eXtreme Performance Input/Output (XPIO) circuits, and/or the like. The other IP circuits 118 can be, for example, digital clock managers, analog-to-digital converters, system monitoring logic, and/or any circuit for a given implementation. In some examples, at least some of the memory controller 112, MGTs 114, IOs 116, and/or other IP circuits 118 are configurable. For example, the memory controller 112, MGTs 114, IOs 116, and/or other IP circuits 118 can be configurable via the NPI 122 of the NoC 106.

In some examples, the programmable IC 102 includes an interface and control logic circuit 124. In other examples, the interface and control logic circuit 124 is on a separate IC from the programmable IC 102 (e.g., as indicated by a dashed line). The interface and control logic circuit 124 is connected to external memory 126. External memory 126 can be memory in a single or multiple dies, for example. In some examples, the external memory 126 is random access memory (RAM), such as dynamic RAM (DRAM) that can be implemented as high bandwidth memory (HBM).

In some examples, the interface and control logic circuit 124 is directly connected to the memory controller 112, while in other examples, the interface and control logic circuit 124 is communicatively coupled to the memory controller 112 via an IO 116 of the programmable IC 102 and a IO 128 of another IC (e.g., as shown by dashed arrows in FIG. 1). In some examples where the programmable IC 102 includes the interface and control logic circuit 124, the memory controller 112 is directly connected to the interface and control logic circuit 124 (e.g., without intervening physical layer (PHY) interfaces), which is in turn connected to the external memory 126. In some examples where the interface and control logic circuit 124 is in a separate IC from the programmable IC 102, the memory controller 112 is directly connected to the interface and control logic circuit 124 (e.g., without intervening physical layer (PHY) interfaces), which is in turn connected to the external memory 126. In some examples where the interface and control logic circuit 124 is in a separate IC from the programmable IC 102, the memory controller 112 is directly connected to an IO 116 (e.g., a HBM interface), and the IO 116 is connected to the IO 128 (e.g., a HBM interface) of the separate IC, which is connected to the interface and control logic circuit 124. The interface and control logic circuit 124 is in turn connected to the external memory 126. Hence, in these examples, the memory controller 112 is communicatively coupled to the external memory 126.

In some examples, and as detailed below, the programmable IC 102, the interface and control logic circuit 124 (if on a separate IC), and the external memory 126 can be included in dies that are stacked to form a multi-chip structure. Such a multi-chip structure can have a smaller package size and can be manufactured using reduced processing, which can increase yield and reduce time to manufacture the multi-chip structure.

Figure 2:
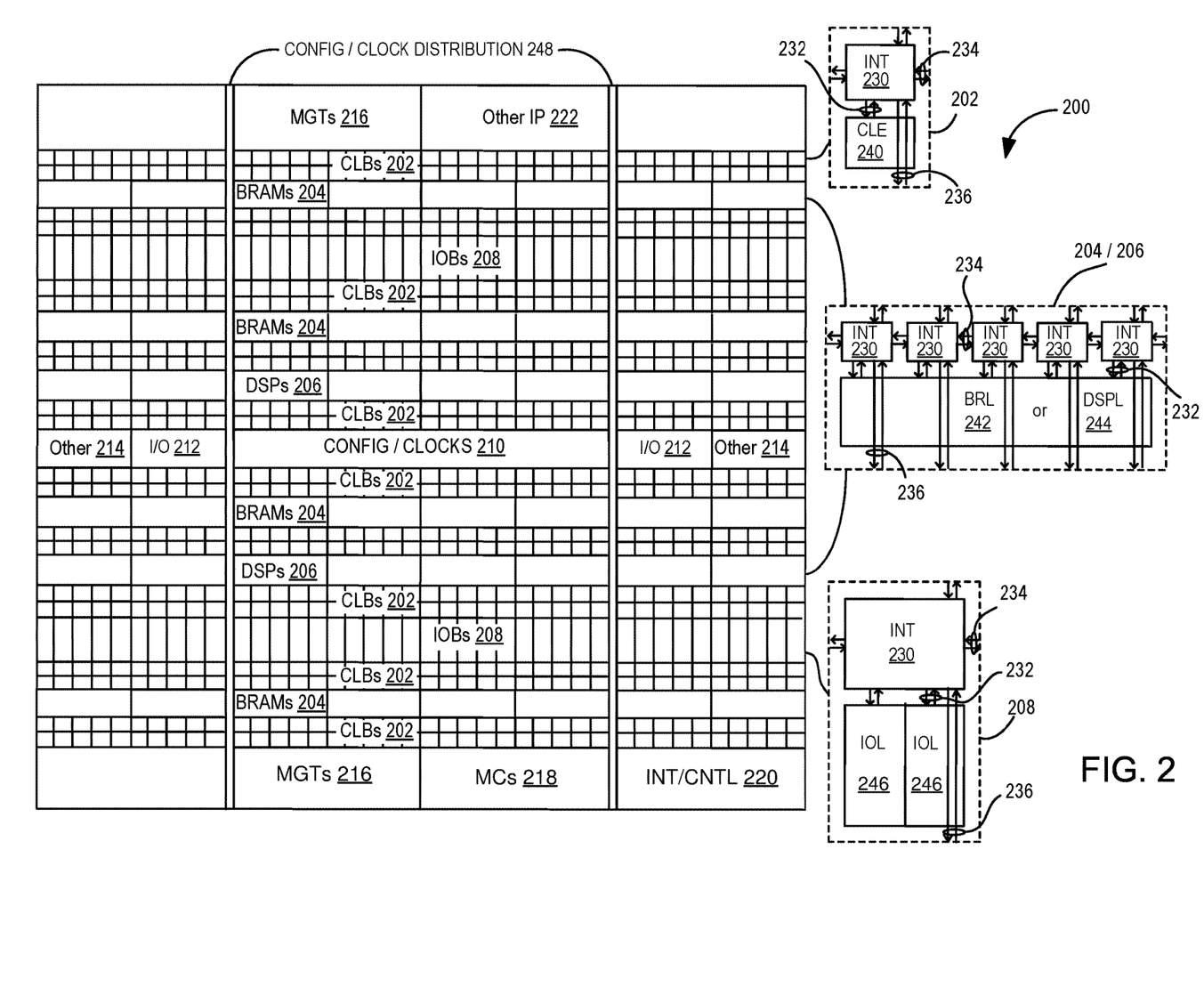
FIG. 2 depicts a field programmable gate array (FPGA) of a programmable IC according to some examples.

FIG. 2 illustrates a field programmable gate array (FPGA) of a programmable IC 200 that may be implemented as the programmable IC 102 of FIG. 1 according to some examples. The programmable IC 200 includes a large number of different programmable tiles including configurable logic blocks (CLBs) 202, random access memory blocks (BRAMs) 204, signal processing blocks (DSPs) 206, input/output blocks (IOBs) 208, configuration and clocking logic (CONFIG/CLOCKS) 210, specialized input/output blocks (I/O) 212 (e.g., configuration ports and clock ports), and other programmable logic 214 such as digital clock managers, system monitoring logic, and so forth. The programmable IC 200 can also include boundary circuits, such as MGTs 216, memory controllers (MCs) 218, interface and control logic circuit (INT/CNTL) 220, and other IP circuits 222, such as PCIe interfaces, analog-to-digital converters (ADC), and the like. The boundary circuits may also be programmable.

In some FPGAs, each programmable tile can include at least one programmable interconnect element (INT) 230 having connections to input and output terminals 232 of a programmable logic element within the same tile, as shown by examples included in FIG. 2. Each programmable interconnect element 230 can also include connections to interconnect segments 234 of adjacent programmable interconnect element(s) in the same tile or other tile(s). Each programmable interconnect element 230 can also include connections to interconnect segments 236 of general routing resources between logic blocks (not shown). The general routing resources can include routing channels between logic blocks (not shown) comprising tracks of interconnect segments (e.g., interconnect segments 236) and switch blocks (not shown) for connecting interconnect segments. The interconnect segments of the general routing resources (e.g., interconnect segments 236) can span one or more logic blocks. The programmable interconnect elements 230 taken together with the general routing resources implement a programmable interconnect structure for the illustrated FPGA.

In an example implementation, a CLB 202 can include a configurable logic element (CLE) 240 that can be programmed to implement user logic plus a single programmable interconnect element 230. A BRAM 204 can include a BRAM logic element (BRL) 242 in addition to one or more programmable interconnect elements 230. Typically, the number of programmable interconnect elements 230 included in a tile depends on the height of the tile. In the depicted example, a BRAM 204 has the same height as five CLBs 202, but other numbers (e.g., four) can also be used. A signal processing block 206 can include a DSP logic element (DSPL) 244 in addition to an appropriate number of programmable interconnect elements 230. An 10B 208 can include, for example, two instances of an input/output logic element (IOL) 246 in addition to one instance of the programmable interconnect element 230. As will be clear to those of skill in the art, the actual I/O pads connected, for example, to the input/output logic element 246 typically are not confined to the area of the input/output logic element 246.

In the pictured example, a horizontal area near the center of the die is used for the configuration and clocking logic (CONFIG/CLOCKS) 210, and, possibly, other control logic. Vertical columns 248 extending from this horizontal area or column are used to distribute the clocks and configuration signals across the breadth of the FPGA.

Some FPGAs utilizing the architecture illustrated in FIG. 2 can include additional logic blocks that disrupt the regular columnar structure making up a large part of the FPGA. The additional logic blocks can be programmable blocks and/or dedicated logic.

Note that FIG. 2 is intended to illustrate only an example FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 2 are purely an example. For example, in an actual FPGA more than one adjacent row of CLBs is typically included wherever the CLBs appear, to facilitate the efficient implementation of user logic, but the number of adjacent CLB rows varies with the overall size of the FPGA.

Figure 3:
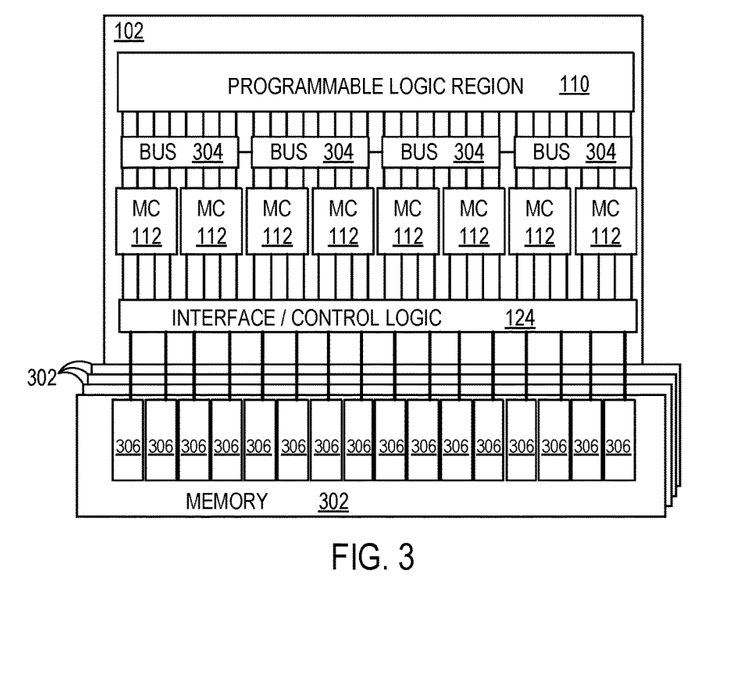
FIGS. 3, 4, and 5 are circuit schematic diagrams of respective multi-chip structures according to some examples.

FIG. 3 is a circuit schematic diagram of a multi-chip structure according to some examples. The multi-chip structure of FIG. 3 includes a programmable IC 102 and memory 302, where the memory 302 can be in multiple dies stacked on a die including the programmable IC 102. As simplified in FIG. 3, the programmable IC 102 includes a programmable logic region 110, buses 304, memory controllers 112, and interface and control logic circuit 124. The programmable logic region 110 (or other subsystem, such as the processing system 104 and/or NoC 106) is connected to the memory controllers 112 via the buses 304, which may be Advanced extensive Interface (AXI) buses, for example. The memory controllers 112 are connected to the interface and control logic circuit 124.

Each of the memory 302 includes multiple memory slices 306. In some examples, each memory slice 306 can be 2 Gigabytes (Gb) of memory or other sizes. Each of the memory 302 can implement DRAM, and can further implement HBM. In some examples, each of the memory 302 can implement 32 Gb of HBM DRAM. The interface and control logic circuit 124 is connected to the memory slices 306 of the memory 302. The interface and control logic circuit 124 can decode read and write requests from the memory controllers 112 and responsively transmit native signals to the memory 302 to read or write from the memory 302. No standardized physical layer interface circuit to package and unpackage read and write requests in and from a standardized form is between the memory controllers 112 and the memory slices 306 of the memory 302. For example, if the memory 302 implements HBM, no HBM interface is between the memory controllers 112 and the memory slices 306.

Figure 4:
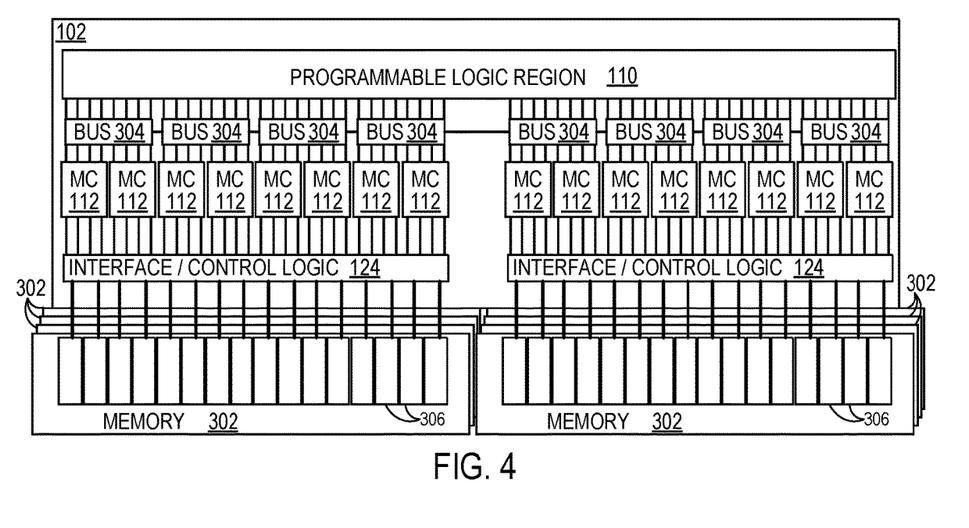

FIG. 4 is a circuit schematic diagram of another multi-chip structure according to some examples. The multi-chip structure of FIG. 4 is similar to the multi-chip structure of FIG. 3 except that two stacks of dies including memory 302 are stacked on the die including the programmable IC 102. The programmable IC 102 further includes additional buses 304, memory controllers 112, and interface and control logic circuit 124 to accommodate the additional stack of dies including memory 302.

In the examples of FIGS. 3 and 4, the interface and control logic circuits 124 are included in the respective dies including the programmable ICs 102. In other examples, another control die (separate from the die including the programmable IC 102) can include the interface and control logic circuit(s) 124 and can be interposed between the die including the programmable IC 102 and the stack(s) of dies including memory 302. The circuit schematic diagrams of such examples would be the same as FIGS. 3 and 4 except to indicate the separate control die.

Figure 5:
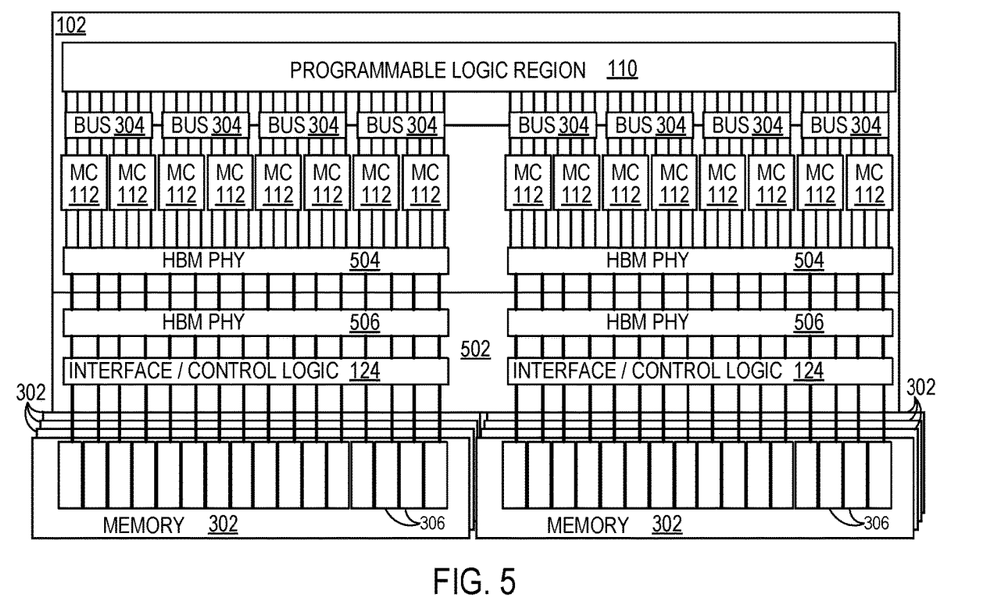

FIG. 5 is a circuit schematic diagram of a further multi-chip structure according to some examples. The multi-chip structure of FIG. 5 implements HBM interfaces (e.g., as PHY interfaces) between memory controllers 112 and memory slices 306. The multi-chip structure of FIG. 5 includes a programmable IC 102, a control IC 502, and memory 302, where the control IC 502 is in a die stacked on and separate from a die including the programmable IC 102, and the memory 302 can be in multiple dies stacked on the die including the control IC 502. As simplified in FIG. 5, the programmable IC 102 includes a programmable logic region 110, buses 304, memory controllers 112, and HBM interfaces (HBM PHY) 504. The programmable logic region 110 (or other subsystem, such as the processing system 104 and/or NoC 106) is connected to the memory controllers 112 via the buses 304, and the memory controllers 112 are connected to the HBM interfaces 504. The HBM interfaces 504 are configured to package read and write requests from the memory controllers 112 into, e.g., a standardized HBM format, and to unpack responses from memory 302 from the standardized HBM format to a format useable by the memory controllers 112.

The control IC 502 includes HBM interfaces (HBM PHY) 506 and interface and control logic circuits 124. The HBM interfaces 506 of the control IC 502 are connected to the HBM interfaces 504 of the programmable IC 102. The HBM interfaces 506 are configured to unpack read and write requests from the HBM interfaces 504 from, e.g., a standardized HBM format into a native format useable by the interface and control logic circuit 124 and to package responses from memory 302 to the standardized HBM format to transmit to the HBM interfaces 504 of the programmable IC 102. The interface and control logic circuit 124 can decode read and write requests from the HBM interfaces 506 and responsively transmit native signals to the memory 302 to read or write from the memory 302 on various memory dies. The circuit schematic diagram of FIG. 5 can be modified to implement a single stack of memory dies similar to the differences between FIGS. 3 and 4.

Figure 6:
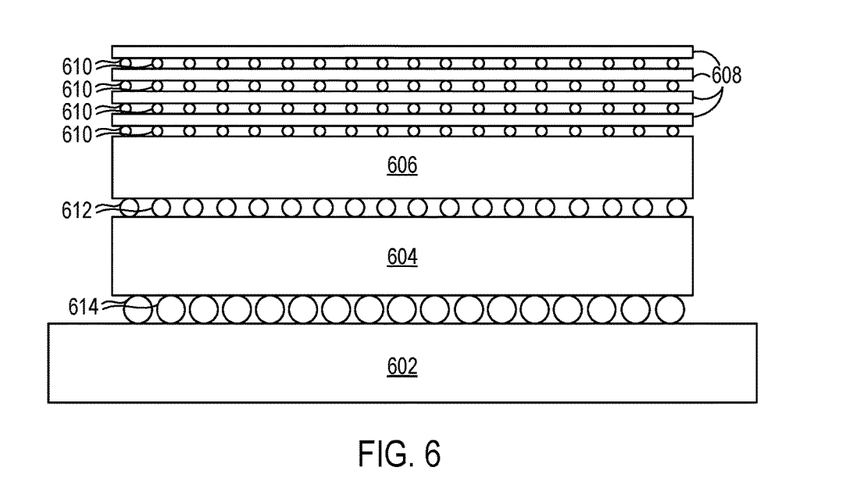
FIGS. 6, 7 and 8 are configurations of multi-chip structures on a printed circuit board (PCB) according to some examples.

FIG. 6 is a configuration of a multi-chip structure on a printed circuit board (PCB) 602 according to some examples. The multi-chip structure includes a package substrate 604, a base die 606 on the package substrate 604, and memory dies 608 stacked on the base die 606. The base die 606 includes a programmable IC 102, such as in FIGS. 3 and/or 4, and the memory dies 608 each include the memory 302, such as in FIGS. 3 and/or 4.

The multi-chip structure includes a stack of four stacked memory dies 608, although other examples can implement any number of memory dies 608 in any number of stacks. Each memory die 608 has external connectors 610, such as microbumps, attached to an active side of the memory die 608 and attached to a backside of an underlying die. Each memory die 608 can include through substrate vias (TSVs) through the semiconductor substrate on which the memory 302 of the respective memory die 608 is formed. The TSVs can be implemented to electrically connect memory 302 of an overlying memory die 608 to the respective memory die 608 and/or to an underlying die.

The programmable IC 102 of the base die 606 includes the interface and control logic circuit 124 as depicted in FIGS. 3 and/or 4. The bottom memory die 608 of the stack of memory dies 608 has external connectors 610 attached to an active side of the bottom memory die 608 and to a backside of the base die 606. The base die 606 can include TSVs through the semiconductor substrate on which, e.g., the programmable IC 102 is formed. The TSVs can be implemented to electrically connect the memory 302 of the overlying memory dies 608 to the programmable IC 102. The base die 606 further has external connectors 612, such as controlled collapse chip connections (C4) bumps, attached to an active side of the base die 606 and attached to a first side of the package substrate 604. A second side of the package substrate 604 opposite from the first side has external connectors 614, such as ball grid array (BGA) balls, attached, which are further attached to the PCB 602.

Figure 7:
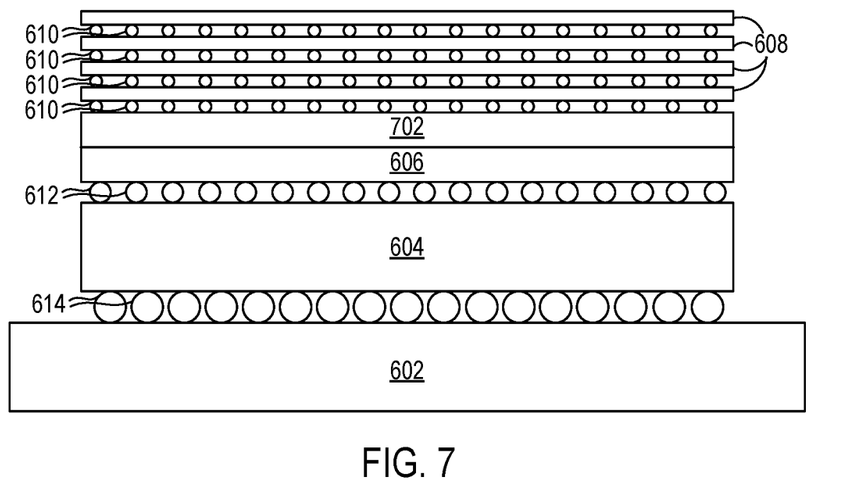

FIG. 7 is another configuration of a multi-chip structure on a PCB 602 according to some examples. The multi-chip structure includes a package substrate 604, a base die 606 on the package substrate 604, a control die 702 on the base die 606, and memory dies 608 stacked on the control die 702. The base die 606 includes a programmable IC 102, such as in FIGS. 3 and/or 4 without the interface and control logic circuit 124. The control die 702 includes a control IC including the interface and control logic circuit 124, such as in FIGS. 3 and/or 4. The memory dies 608 each include the memory 302, such as in FIGS. 3 and/or 4.

Like in FIG. 6, the multi-chip structure of FIG. 7 includes a stack of four stacked memory dies 608, although other examples can implement any number of memory dies 608 in any number of stacks. The bottom memory die 608 of the stack of memory dies 608 has external connectors 610 attached to an active side of the bottom memory die 608 and to a backside of the control die 702. The control die 702 can include TSVs through the semiconductor substrate on which, e.g., the logic structures (e.g., transistors) of the control die 702 are formed. The TSVs can be implemented to electrically connect memory 302 of the overlying memory dies 608 to the control IC (e.g., the interface and control logic circuit 124) of the control die 702 and/or the programmable IC 102. An active side of the control die 702 is attached to a backside of the base die 606. For example, the active side of the control die 702 can be bonded to the backside of the base die 606 via, e.g., oxide-to-oxide and/or metal-to-metal bonding by wafer bonding or other bonding techniques. The base die 606 has external connectors 612 attached to an active side of the base die 606 and attached to a first side of the package substrate 604. A second side of the package substrate 604 opposite from the first side has external connectors 614 attached, which are further attached to the PCB 602.

Figure 8:
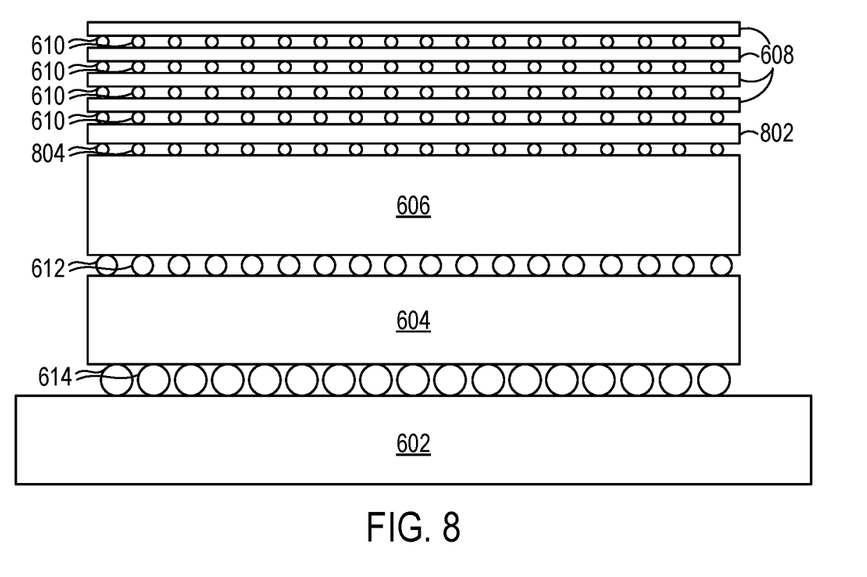

FIG. 8 is another configuration of a multi-chip structure on a PCB 602 according to some examples. The multi-chip structure includes a package substrate 604, a base die 606 on the package substrate 604, a control die 802 on the base die 606, and memory dies 608 stacked on the control die 802. The base die 606 includes a programmable IC 102, such as in FIG. 5. More specifically, the programmable IC 102 also includes HBM interfaces 504 as depicted in FIG. 5. The control die 802 includes a control IC 502, such as in FIG. 5. More specifically, the control IC 502 of the control die 802 includes the interface and control logic circuit 124 and HBM interfaces 506 as depicted in FIG. 5. The memory dies 608 each include the memory 302, such as in FIG. 5.

Like in FIG. 6, the multi-chip structure of FIG. 8 includes a stack of four stacked memory dies 608, although other examples can implement any number of memory dies 608 in any number of stacks. The bottom memory die 608 of the stack of memory dies 608 has external connectors 610 attached to an active side of the bottom memory die 608 and to a backside of the control die 802. The control die 802 can include TSVs through the semiconductor substrate on which, e.g., the logic structures (e.g., transistors) of the control IC 502 are formed. The TSVs can be implemented to electrically connect memory 302 of the overlying memory dies 608 to the control IC 502 of the control die 802 and/or the programmable IC 102. The control die 802 has external connectors 804, such as microbumps, attached to an active side of the control die 802 and attached to a backside of the base die 606. The base die 606 has external connectors 612 attached to an active side of the base die 606 and attached to a first side of the package substrate 604. A second side of the package substrate 604 opposite from the first side has external connectors 614 attached, which are further attached to the PCB 602.

Although various multi-chip structures described with respect to FIGS. 6 through 8 have been described with various dies having a specified orientation (e.g., certain active sides of dies attached to backsides of other dies), such orientations are provided as examples. Any die (e.g., any base die 606, memory die 608, control die 702, and/or control die 802) can be, e.g., flipped relative to the description provided above or can have any other orientation.

The multi-chip structures described above can be programmatically accessible dense memory devices. A programmable device with dense memory leveraging HBM logic and stacking technology can be implemented by structures described above. Performance benefits associated with programmable ICs (e.g., FPGAs) can be maintained while incurring faster and simpler manufacturing, lower cost manufacturing, and lower power consumption.

Some examples can be implemented with any variety of a programmable IC. For example, the programmable IC can be an application specific standard parts (ASSP) IC with, e.g., configurable input/output circuits and interfaces. Some examples can be implemented with multi-ported memory with host interfaces such as nxPCIe Genx, nx100GE, nx40G, nx10GE, 112G PAM4, or others.

Figure 9:
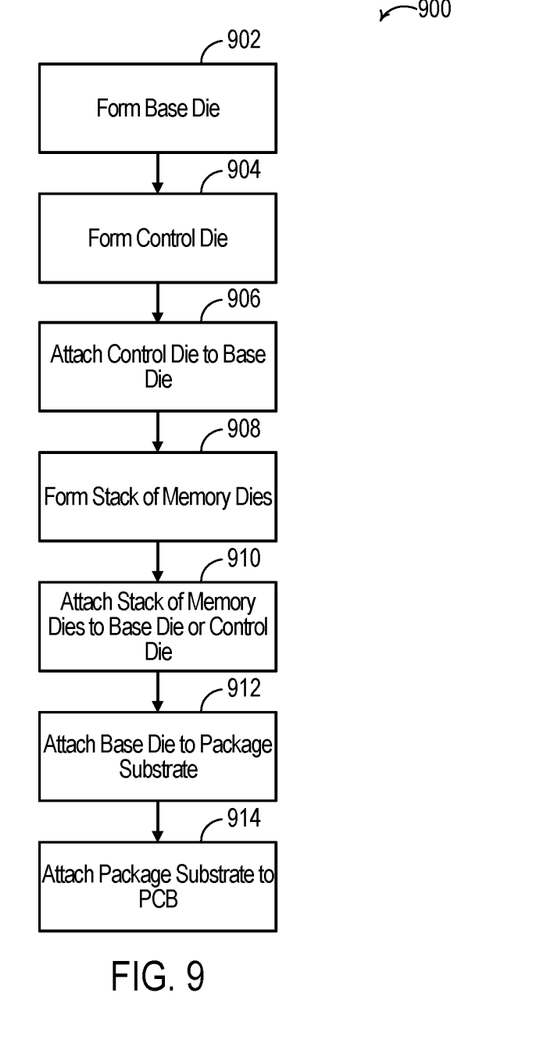
FIG. 9 is a flowchart of a method for forming a multi-chip structure according to some examples.

FIG. 9 is a flowchart of a method 900 for forming a multi-chip structure according to some examples. In block 902, a base die is formed. The base die can be the base die 606 of FIGS. 6 through 8, for example, and can be formed by front side and backside semiconductor processing to implement a programmable IC and TSVs in the base die.

Optionally, in block 904, a control die is formed. The control die can be the control dies 702 and/or 802 of FIGS. 7 and/or 8, for example, and likewise, can be formed by front side and backside semiconductor processing to implement a control IC and TSVs in the control die. Optionally, in block 906, the control die is attached to the base die. For example, the control die can be bonded to the base die by wafer-to-wafer bonding during processing of the control die and base die (e.g., before singulating the dies). As another example, the control die can be attached to the base die using external connectors, such as microbumps, which can include reflowing the external connectors to attach the control die to the base die. In some examples, a control die is not implemented, such as to form the multi-chip structure of FIG. 6, and hence, forming the control die in block 904 and attaching the control die to the base die in block 906 can be omitted.

In block 908, a stack of memory dies is formed. The stack of memory dies can be the memory dies 608 of FIGS. 6 through 8, for example, and each memory die can be formed by front side and backside semiconductor processing to implement memory and TSVs in the memory die, except a top memory die may omit backside semiconductor processing and TSVs. The memory dies can be attached to each other in a stack, such as by using external connectors, such as microbumps, which can include reflowing the external connectors to attach the memory dies together.

In block 910, the stack of memory dies is attached to the base die or, if implemented, the control die. The stack of memory dies can be attached to the base die (e.g., as in FIG. 6) or to the control die (e.g., as in FIG. 7 or 8) using external connectors, such as microbumps, which can include reflowing the external connectors to attach the stack of memory dies to the base die or control die. As indicated above, the order of operations can be varied. For example, when a control die is implemented, such as in FIG. 8, the stack of memory dies can be attached to the control die before the control die is attached to the base die.

In block 912, the base die is attached to a package substrate. The package substrate can be the package substrate 604 of FIGS. 6 through 8, for example, and can be attached to the base die using external connectors, such as C4 bumps, which can include reflowing the external connectors to attach the base die to the package substrate.

In block 914, the package substrate is attached to a PCB. The PCB substrate can be the PCB 602 of FIGS. 6 through 8, for example, and can be attached to the package substrate using external connectors, such as BGA balls, which can include reflowing the external connectors to attach the package substrate to the PCB.

While the foregoing is directed to specific examples, other and further examples may be devised without departing from the basic scope thereof, and the scope thereof is determined by the claims that follow.

What is claimed is:
1. A multi-chip structure comprising:
a package substrate;

a first die mounted directly on the package substrate, the first die comprising a programmable integrated circuit;

a second die comprising a memory controller, the second die being stacked on the first die, the memory controller being communicatively coupled to the package substrate through the programmable integrated circuit; and a third die comprising memory, the third die being stacked on the second die, the memory being communicatively coupled to the package substrate sequentially through the memory controller and the programmable integrated circuit.

2. The multi-chip structure of claim 1, wherein the first die includes a semiconductor substrate, through substrate vias (TSVs) being through the semiconductor substrate, the memory controller being communicatively coupled to the memory via the TSVs.

3. The multi-chip structure of claim 1, wherein a fourth die is attached to a side of the third die opposite from the package substrate by external electrical connectors.

4. The multi-chip structure of claim 1, wherein no physical layer interface is disposed communicatively and electrically between the memory controller and the memory.

5. The multi-chip structure of claim 1, wherein the programmable integrated circuit includes a field programmable gate array (FPGA).

6. A method of forming a multi-chip structure, the method comprising:

stacking a first die directly on a package substrate without an intervening interposer, the first die comprising a programmable integrated circuit;

stacking a second die on the first die, the second die comprising a memory controller, the memory controller being communicatively coupled to the package substrate through the programmable integrated circuit; and stacking a third die on the second die, the third die comprising memory, the memory being communicatively coupled to the package substrate sequentially through the memory controller and the programmable integrated circuit.

7. The method of claim 6, wherein:

stacking the first die on the second die includes attaching the first die to the second die by external electrical connectors;

the first die includes a control logic circuit, the control logic circuit being disposed communicatively between the memory controller and the memory; and no physical layer interface is disposed communicatively and electrically between the memory controller and the memory.

8. The method of claim 6, wherein the first die comprises a control logic circuit, the control logic circuit communicatively coupled between the memory controller and the memory.

9. A multi-chip structure comprising:

a package substrate;

a first die comprising a field programmable gate array (FPGA) having a programmable integrated circuit, the first die being on and attached directly to the package substrate without an intervening interposer; a second die comprising a memory controller, the second die being stacked on the first die, the memory controller being communicatively coupled to the package substrate through the programmable integrated circuit; and a plurality of memory dies stacked on the second die, the memory dies being communicatively coupled to the package substrate sequentially through the memory controller and the programmable integrated circuit.

10. The multi-chip structure of claim 9, wherein no physical layer interface is disposed communicatively and electrically between the memory controller and the plurality of memory dies.

11. The multi-chip structure of claim 9, wherein the second die further comprises:

control logic circuit disposed communicatively between the memory controller and the plurality of memory dies.

12. The multi-chip structure of claim 9, wherein the second die is bonded to the first die.

13. The multi-chip structure of claim 9, wherein the second die is attached to a side of the first die opposite from the package substrate by external electrical connectors.

14. The multi-chip structure of claim 9, wherein the second die is attached to one of the plurality of memory dies by external electrical connectors.

15. The multi-chip structure of claim 14, wherein no physical layer interface is disposed communicatively and electrically between the memory controller and the memory.

16. The multi-chip structure of claim 14, wherein:

the first die includes a first physical layer interface communicatively coupled to the memory controller; and one of the plurality of memory dies die includes a second physical layer interface communicatively coupled to and between the first physical layer interface and a control logic circuit.

17. A method of forming a multi-chip structure, the method comprising:

stacking a first die on a second die, the first die comprising memory, the second die comprising a programmable integrated circuit, the programmable integrated circuit including a memory controller, the memory controller being communicatively coupled to the memory by the first die being stacked on the second die wherein the second die includes a control logic circuit disposed communicatively between the memory controller and the memory and configured to decode read and write requests from the memory controller and responsively transmit native signals to the memory to read or write from the memory; and attaching the first die directly to a package substrate without an intervening interposer, wherein the memory controller is communicatively coupled to the package substrate through the programmable integrated circuit.

* * * * *